United States Patent [19]
Goldin

[11] Patent Number: 5,969,654
[45] Date of Patent: Oct. 19, 1999

[54] MULTI-CHANNEL RECORDING SYSTEM FOR A GENERAL PURPOSE COMPUTER

[75] Inventor: Alexander A. Goldin, Haifa, Israel

[73] Assignee: International Business Machines Corporation, Armonk, N.Y.

[21] Appl. No.: 08/961,115

[22] Filed: Oct. 30, 1997

[30] Foreign Application Priority Data

Nov. 15, 1996 [EP] European Pat. Off. .............. 96480107

[51] Int. Cl.$^6$ ...................................................... G08B 5/22
[52] U.S. Cl. ............................................................ 341/141
[58] Field of Search ..................................... 341/141, 155

[56] References Cited

U.S. PATENT DOCUMENTS

| | | | |
|---|---|---|---|
| 3,976,869 | 8/1976 | Stella et al. .............................. | 235/189 |
| 4,131,766 | 12/1978 | Narasimba ......................... | 179/15 FD |
| 4,677,422 | 6/1987 | Naito ....................................... | 341/122 |
| 5,327,132 | 7/1994 | Whitecar et al. ....................... | 341/141 |
| 5,686,917 | 11/1997 | Odom et al. ............................ | 341/141 |

*Primary Examiner*—Michael Tokar
*Assistant Examiner*—Anh Tran
*Attorney, Agent, or Firm*—John D. Flynn

[57] ABSTRACT

Multi-channel recording system for audio signals comprising a general purpose computer (13) having a sound card (18) with two analog-to-digital converters (20, 22) for receiving two analog audio signals and recording these signals into digital form into a memory, and comprising an analog multiplexer (10, 12) arranged to combine a plurality n of input audio signals in analog form and to supply two resulting multiplexed signals (14, 16) to the analog-to-digital converters (20, 22), the computer (13) being arranged to function as a digital de-multiplexer (28, 30) for recovering the input audio signals in digital form and recording them into memory.

9 Claims, 3 Drawing Sheets

MULTI-CHANNEL RECORDING SYSTEM FOR A GENERAL PURPOSE COMPUTER

FIELD OF THE INVENTION

The invention relates to the simultaneous recording of several input audio signals and, in particular, to a multi-channel recording system for input audio signals which can be implemented using a sound card within a general purpose computer.

BACKGROUND ART

Audio capturing hardware and auxiliary software for recording audio signals have become integral parts of modern computers. This hardware is generally inexpensive and allows the recording of 16 bit mono/stereo signals with a sampling rate up to 44 kHz. Such a high sampling rate is generally not necessary for speech signals where for most applications a sampling rate 11 kHz is sufficient. On the other hand, the quality of the recording is often a problem due to environmental noise, interfering signals, room reverberation, other speakers, etc. Multi-microphone technologies such as beamforming and adaptive beamforming allow significant enhancement in the quality of the recorded signal improving the signal to noise ratio, canceling the interfering signals or environmental noise, reducing reverberation, tracking the speaker movements, etc.

Today, it is possible to perform stereo recording without using special or highly separated microphones, which is important for video conferencing applications. Noise cancellation is probably a classical application of multi-microphone technologies. Additional noise cancellation means produce an output signal clear from any signal but the signal of interest. It is known from the theory of beamforming that, by using N spatially separated omnidirectional microphones, it is theoretically possible to clean the signal of interest from up to N−1 interfering signals if they come from directions different from the direction of interest. One application of noise cancellation is to use it as a front end for a speech recognition system. Voice communication in a noisy environment is another application where the user may greatly benefit from improved signal-to-noise ratio of the transmitted signals.

Since the microphones are separated in space and sound sources are located in specific places (at least temporarily), the microphones record different signals. In the simplest (ideal) case, the signals are just delayed versions of each other. In more complex cases they may be filtered versions of each other or even contain independent information. In any case, these differences have spatial origin and hence may be exploited to extract spatial information about recorded sounds.

Unfortunately, use and development of these advanced technologies is hampered by the lack of hardware allowing simultaneous recording of multi-channel signals into a computer memory. Furthermore, many other applications might immediately emerge as soon as an inexpensive technology for recording multi-channel or multi-microphone signals become available.

SUMMARY OF THE INVENTION

The main object of the invention is therefore to enable the advantages of multi-channel recording to be exploited in a personal computer by using the existing sound card and only relatively inexpensive additional hardware.

In brief, this is achieved by a multi-channel recording system for audio signals comprising a general purpose computer having an analog-to-digital converter for receiving an analog audio signal and recording this signal in digital form into a memory generally within the general purpose computer, such a system being characterized in that it comprises an analog multiplexer arranged to combine a plurality of input audio signals in analog form and to supply at least a resulting multiplexed analog signal to the analog-to-digital converter, the computer being arranged to function as a digital de-multiplexer for covering the input audio signals in digital form and recording them into memory.

BRIEF DESCRIPTION OF THE DRAWINGS

The foregoing and other objects and advantages of the invention will be better understood from the following description of the preferred embodiment of the invention with reference to the accompanying drawings in which.

DETAILED DESCRIPTION OF THE INVENTION

Figure 1:
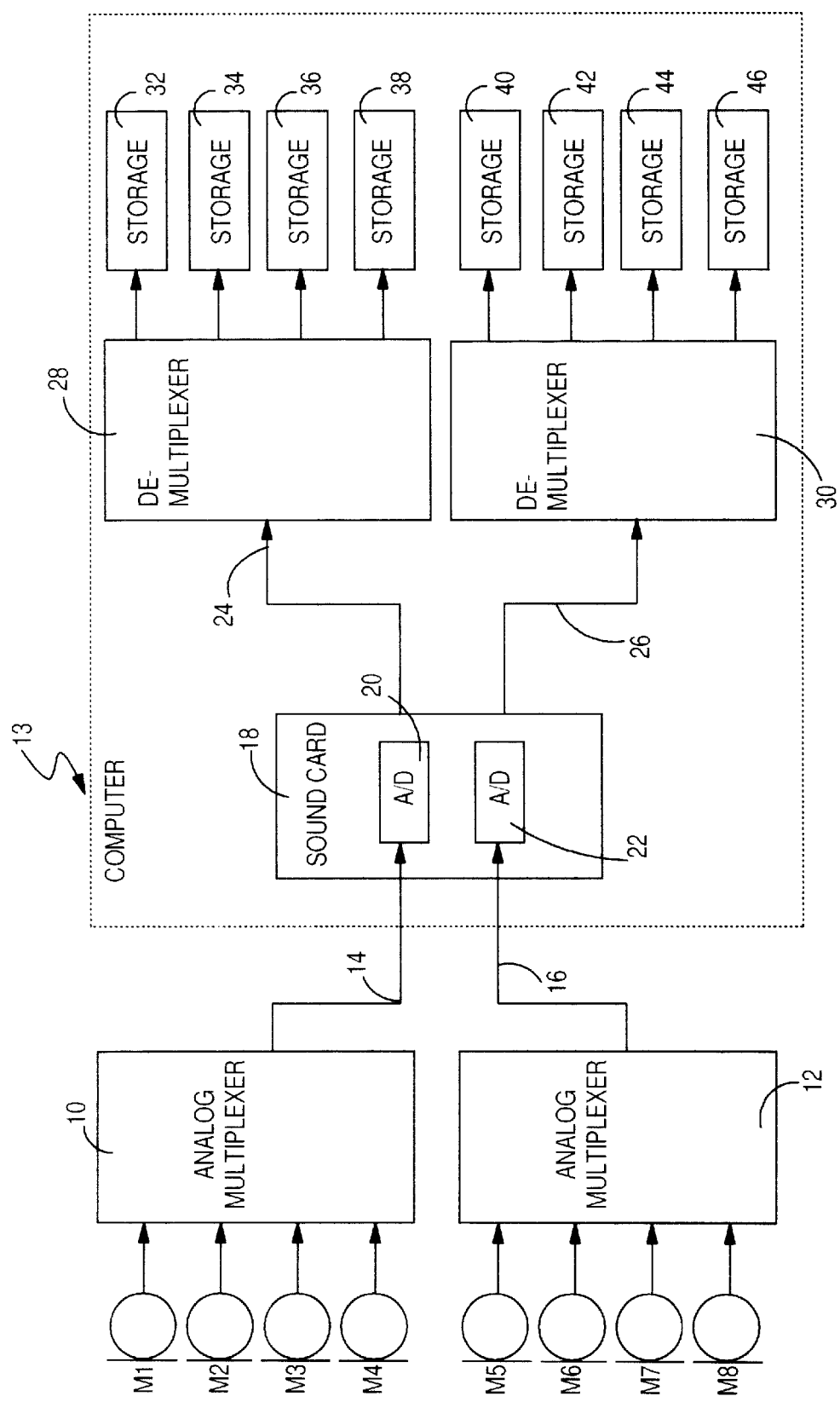
FIG. 1 is a block diagram of a preferred embodiment of the multi-channel recording system according to the invention.

In the embodiment, Frequency Division Multiplexing (FDM) is used to combine analog signals from four microphones into one signal of quadruple frequency recorded by the computer. Such a combination is performed by an analog multiplexer (4*1) for each one of the two channels of a sound card within a general purpose computer. Thus, in FIG. 1, the analog audio signals coming from microphones M1, M2, M3, M4 are combined in multiplexer 10 whereas the analog audio signals coming from microphones M5, M6, M7, M8 are combined in multiplexer 12.

Multiplexers 10 and 12 provide respectively analog signals on outputs 14 and 16 in the frequency bandwidth of 22 kHz, at the input of computer 13. These two analog signals are digitized by the standard sound card 18 of the computer having analog to digital converters 20 and 22 operating at the sampling rate of 44 kHz. Then, the two digitized signals (with the sampling rate 44 kHz) supplied on the converter output 24 and 26 are respectively separated by the two digital signal processing blocks 28 and 30 functioning as de-multiplexers into 8 digital signals with the sampling rate 11 kHz each. The processing in blocks 28 and 30 is performed so that each of the signals is the digitized version of the corresponding analog signal on the input of the system.

The 8 digitized signals are then stored into storage areas 32 to 46 which can be different locations of the computer memory. Note that the digitized signals could be equally transmitted on any transmission media to be stored into external storage areas.

Figure 2:
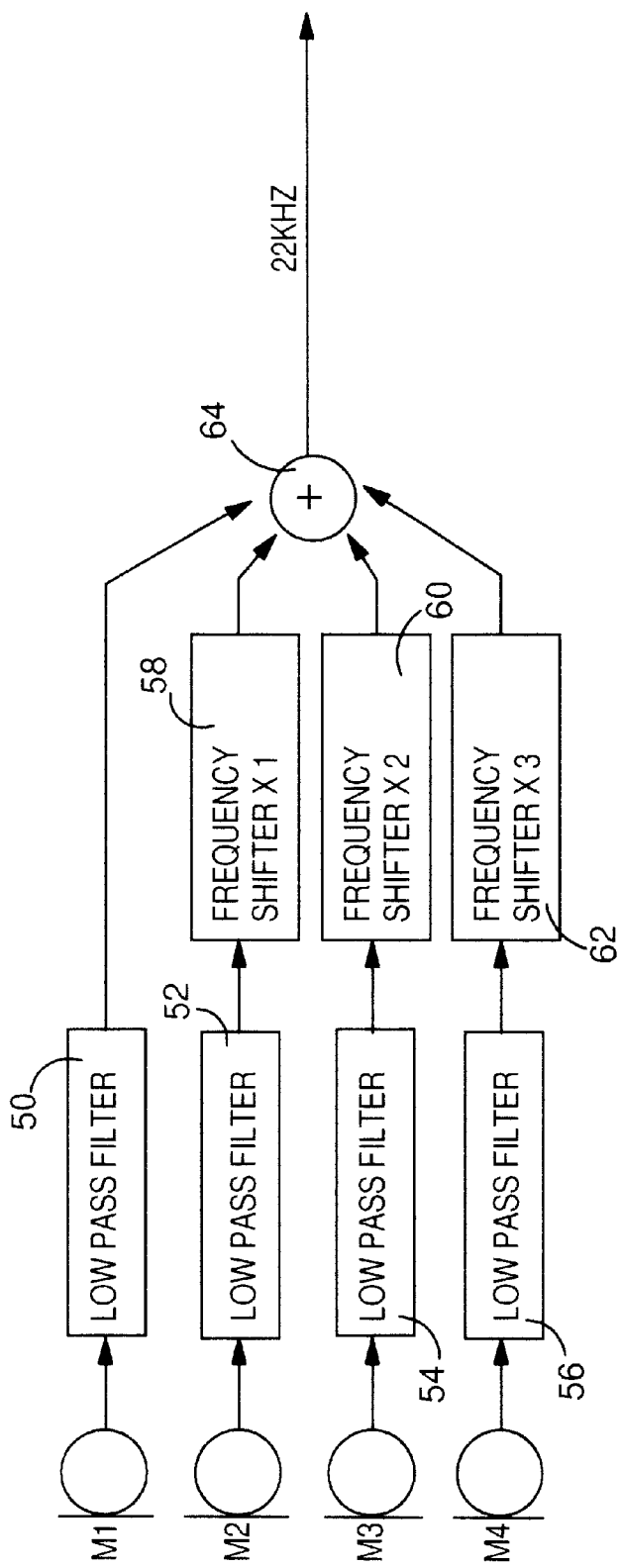
FIG. 2 is a block diagram of one analog multiplexer used to combine the input audio signals received from the microphones in the embodiment illustrated in FIG. 1.

Multiplexer 10 (multiplexer 12 is identical) is illustrated in FIG. 2. Every analog signal from microphones M1, M2, M3, M4 is first filtered by an analog low-pass filter 50, 52, 54 or 56 with a 5.5 kHz cut-off frequency. Then, Frequency Division Multiplexing (FDM) is is used to combine the four analog signals of 5.5 kHz bandwidth received from the low-pass filters 50, 52, 54 and 56 into an analog signal having a bandwidth of 22 kHz. To achieve that, each signal derived from microphone M$i$ is shifted by the frequency $(i-1)\times 5.5$ kHz.

Thus, the signal from M1 is, not shifted, the signal from M2 is shifted by 5.5 kHz in the frequency shifter 58, the signal from M3 is shifted by 11 kHz in the frequency shifter 60 and the signal from M4 is shifted by 16.5 kHz in the frequency shifter 62. All the frequency shifted signals are then summed up in the summer 64 to produce one signal.

Figure 3:
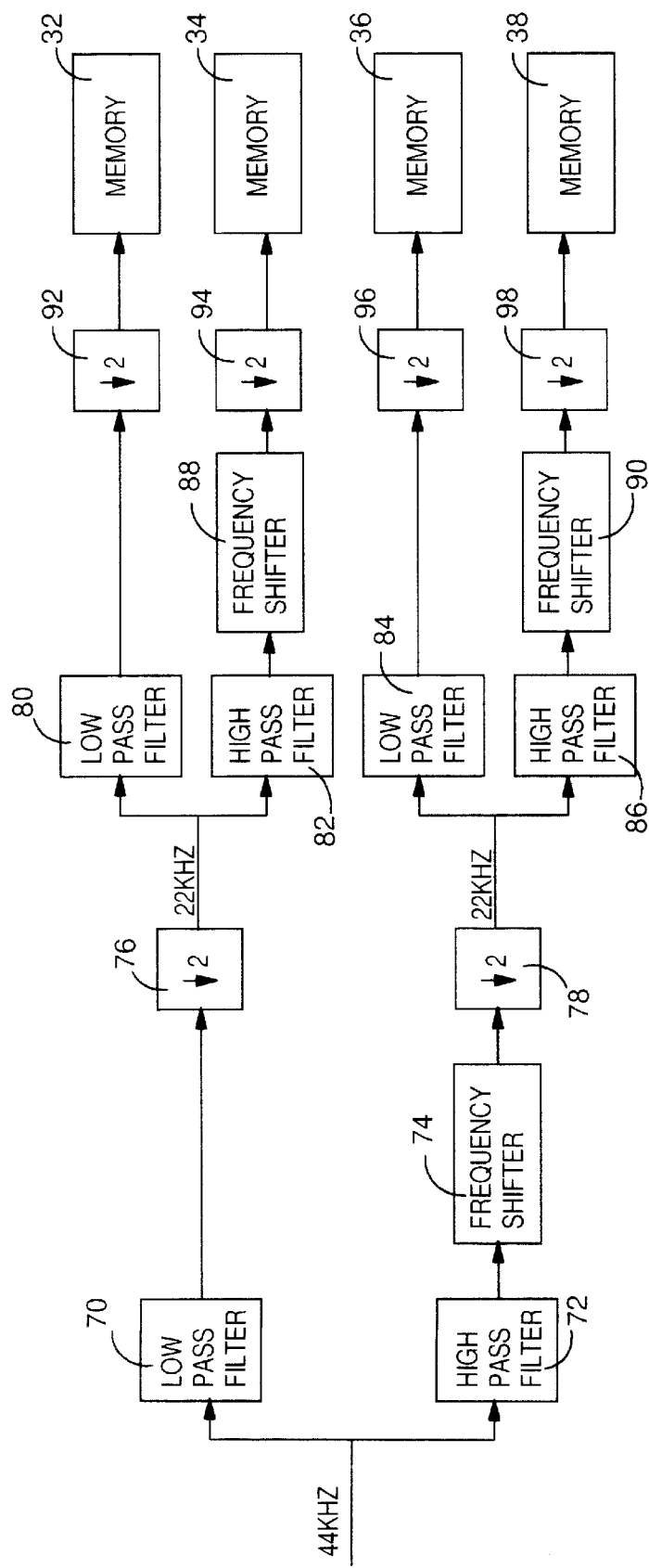
FIG. 3 is a block diagram of one of the processing block within the computer used to recover the input audio signals in digital form in the embodiment illustrated in FIG. 1.

Each of the two digital signals with 44 kHz sampling rate produced by sound card 18 (see FIG. 1) is de-multiplexed in block 28 (or block 30) as illustrated in FIG. 3. The signal passes two identical stages before being separated into four signals with a 11 kHz sampling rate. In the first stage, the 44 kHz signal is divided into two half-band signals by means of low-pass filter 70 and high-pass filter 72. The signal output from high-pass filter 72 is then frequency shifted by 11 kHz in the frequency shifting block 74, and both signals now in bandwidth 11 kHz are downsampled by a factor of two in downsampling blocks 76 and 78 respectively.

The same operations as above are carried out on the two signals derived from blocks 76 and 78, these two signals being both in the 11 kHz bandwidth and having a 22 kHz sampling rate. They are first divided into two half-band signals by means of low pass filter 80 and high-pass filter 82 for the first one and 84 and 86 for the second one. The signals output from high-pass filters 82 and 86 are then frequency shifted by 5.5 kHz. in frequency shifting blocks 88 and 90 respectively. Finally, the four resulting signals now in bandwidth 5.5 kHz are downsampled by a factor of 2 in downsampling blocks 92, 94, 96 and 98 respectively, before being stored in memories 32, 34, 36 and 38 respectively.

The frequency bandwidth is satisfactory for most speech processing applications but may not be enough for music. If higher frequencies are necessary, then a sound card with a sampling rate higher than 44 kHz may be used. In this case, all the frequencies can be scaled by the ratio between the new sampling rate and 44 kHz. Thus, with a sampling rate of 88 kHz, a frequency bandwidth of up to 11 kHz can be used for each channel, which is satisfactory for music signals. If no sound card with higher sampling rate is available, then signals from only two microphones may be prefiltered with the cut-off frequency 11 kHz and then combined in the same way. In such a case, the frequency shift for the analog signals should be 11 kHz and the digital processing block will consist of only one stage and the total number of signals recorded by the standard sound card may be up to four.

While the embodiment described with reference to FIGS. 1, 2 and 3, enables up to 8 input audio signals to be processed by the sound card of the computer, it is clear that more than 8 microphones could be used. Indeed, if the sampling rate used by the sound card is higher than 44 kHz, it becomes possible to multiplex more than 8 signals. Thus, with a sampling rate of 88 kHz, each of the two input channels of the sound card can receive an analog signal of a frequency bandwidth 44 kHz resulting from the multiplexing of 8 analog signals (instead of 4 signals) having each a frequency bandwidth of 5.5 kHz. In such a case, the de-multiplexing block within the computer should be comprised of three stages identical to the two stages illustrated in FIG. 3. Furthermore, it is also possible that the number of microphones allocated to multiplexer 10 be different from the number of microphones allocated to multiplexer 12.

The system has the advantage of utilizing a standard sound card of a general purpose computer, the existing capabilities of the computer together with standard software to carry out the digital signal processing and only small and cheap additional hardware for the analog signal processing.

This invention may serve as a basis for the widespread development and application of multi-microphone technologies which may lead to significant improvement in the signal to noise ratio of the recorded signals or improving the perceived quality of the signals by the recording and the following reproduction of special information about the sources of the recorded sound.

What I claim is:

1. A multi-channel recording system for audio signals comprising:

an analog frequency division multiplexer arranged to combine a plurality of input audio signals in analog form into a resulting multiplexed signal;

an analog-to-digital converter for receiving the resulting multiplexed signal from the analog frequency division multiplexer and converting the resulting multiplexed signal into digital form; and, a digital de-multiplexer for recovering the plurality of input audio signals in digital form and recording them into a memory.

2. The multi-channel recording system according to claim 1, wherein each one of the plurality of input audio signals in analog form has a frequency bandwidth of F1, and the analog frequency division multiplexer combines said plurality of input audio signals into a single analog signal having a frequency bandwidth that is the number of input audio signals times F1; and the analog-to-digital converter converts the single analog signal into a digital signal by sampling the single analog signal at a sampling rate F2 which is at least equal to two times the bandwidth of the single analog signal, and where the digital de-multiplexer uses a sampling rate of F2 divided by the number of input audio signals.

3. The multi-channel recording system according to claim 2, wherein said sampling rate F2 of said analog-to-digital converter is equal to eight times F1.

4. The multi-channel recording system according to claim 3, wherein there are four input signals.

5. The multi-channel recording system according to claim 4, wherein the bandwidth of each of the input audio signals is 5.5 kHz and the sampling rate of said analog-to-digital converter is 44 kHz.

6. The multi-channel recording system according to claim 5, wherein said analog-to-digital converter is part of a sound card.

7. The multi-channel recording system according to claim 6, wherein said analog frequency division multiplexer is comprised of:

a first and a second frequency division multiplexers providing two multiplexed signals; each of said multiplexed signals resulting from the multiplexing of a first part of said input audio signals by said first frequency division multiplexer and of a second part of said input audio signals by said second frequency division multiplexer, and the sound card having a first and a second analog-to-digital converters for converting respectively each of said multiplexed signals into digital form.

8. The multi-channel recording system according to any one of claims 1–7, wherein said input audio signals are supplied by microphones.

9. The multi-channel recording system according to any one of claims 1–7, wherein said input audio signals are supplied by microphones and including means for canceling the noise by processing the resulting audio signals recorded in digital form.

\* \* \* \* \*